United States Patent [19]

Ohno

[11] Patent Number: 4,507,846
[45] Date of Patent: Apr. 2, 1985

[54] METHOD FOR MAKING COMPLEMENTARY MOS SEMICONDUCTOR DEVICES

[75] Inventor: Junichi Ohno, Yokohama, Japan

[73] Assignee: Tokyo Shibaura Denki Kabushiki Kaisha, Japan

[21] Appl. No.: 543,971

[22] Filed: Oct. 20, 1983

[30] Foreign Application Priority Data

Oct. 27, 1982 [JP] Japan .................. 57-188620

[51] Int. Cl.³ ........................... H01L 21/265
[52] U.S. Cl. .................... 29/571; 29/576 E; 29/578; 29/580; 148/187
[58] Field of Search .......... 148/1.5, 187; 29/571, 29/576 E, 578, 580; 357/42

[56] References Cited

U.S. PATENT DOCUMENTS

| 3,933,529 | 1/1976 | Goser | 148/1.5 |
| 4,002,501 | 1/1977 | Tamura | 148/188 X |
| 4,097,314 | 6/1978 | Schlesier et al. | 148/187 X |
| 4,217,153 | 8/1980 | Fukunaga et al. | 148/1.5 X |
| 4,277,883 | 7/1981 | Kaplan | 29/576 B |
| 4,280,272 | 7/1981 | Egawa et al. | 148/187 X |
| 4,335,504 | 6/1982 | Lee | 29/571 X |
| 4,385,937 | 5/1983 | Ohmura | 148/187 X |
| 4,399,605 | 8/1983 | Dash et al. | 148/187 X |

Primary Examiner—G. Ozaki
Attorney, Agent, or Firm—Finnegan, Henderson, Farabow, Garrett & Dunner

[57] ABSTRACT

Gate electrodes for respective n channel and p channel transistors are disposed on a semiconductive layer over an oxide layer. A portion of the semiconductive layer existing between the gate electrodes is removed so that the thickness of the semiconductive layer between the gate electrodes is less than that of the semiconductive layer under the gate electrode.

7 Claims, 24 Drawing Figures

4,507,846

METHOD FOR MAKING COMPLEMENTARY MOS SEMICONDUCTOR DEVICES

BACKGROUND OF THE INVENTION

This invention relates to a method for making complementary MOS semiconductors (referred to as CMOS hereafter) and, more particularly, to a method for making silicon on sapphire (SOS) semiconductors.

In general, CMOS, which is provided in an isolated semiconductive layer on an insulative substrate, has p channel and n channel MOS transistors which have high density drain regions in contact with each other at the boundary of the p channel and n channel transistors. This kind of CMOS is made using the following method.

As shown in FIG. 1, after a semiconductive layer 2 is provided on an insulative substrate 1, such as sapphire, gate electrodes 41, 42 of polycrystal silicon are provided on gate oxide layers 31, 32, respectively. Next impurities with a small diffusion coefficient are selectively implanted by ion implantation, for instance using arsenic for the n channel transistor and boron for the p channel transistor. And then, source region 51 and drain region 61 of n+ type and source region 52 and drain region 62 of p+ type are provided by activation treatment, respectively.

In this CMOS, the element area of the transistor may be considerably minimized because the high density drain regions 61, 62 of the n channel transistor and the p channel transistor contact each other at the boundary of the transistors. However, if the source region 51 and the drain region 61 of n channel transistor are provided by ion implantation (or thermal diffusion) of arsenic, the arsenic sometimes does not reach the boundary between the semiconductive layer 2 and insulative substrate 1. So, if the CMOS is used as an inverter, leakage current occurs shown by a dotted line in FIG. 1. That is, if the input (Vin) is biased at a level "L" and the output (Vout) is at level "H" when the p channel transistor is in the "ON" condition, there will be a leakage current from the drain region 62 of the p channel transistor to the source region 51 of the n channel transistor because a forward bias condition will exist between them.

In order to eliminate the above defect, the CMOS shown in FIG. 2 has been used. That is, the source regions 51' 52' and the drain regions 61', 62' of n channel and p channel transistors are so provided in the isolated semiconductive layer 2 that these regions 51', 52', 61', and 62' extend to the boundary between the layer 2 and the insulative substrate 1, in order to prevent any leakage current. However, this CMOS device exhibits the short channel effect because the channel length (Leff) is extremely short.

Alternatively, the source region and drain region can be so provided that they extend to the boundary between the layer and the substrate by minimizing the thickness of the layer thereby eliminating the short channel effect. But the thin semiconductive layer deteriorates crystallinity of the semiconductive layer, and bad crystallinity is deleterious to electrical and other characteristic of the transistor when minimizing the transistor area.

Another method for making COS has been employed in order to prevent the short channel effect and leakage current.

Referring to FIG. 3A, after a semiconductor layer, such as a silicon layer, is grown on an insulative substrate 11 by epitaxial growth, the semiconductive layer is selectively removed so that a semiconductive layer 12 is provided on substrate 11. Arsenic ions and boron ions are implanted in the semiconductive layer 12 in order to make a P-channel transistor area and an N-channel transistor area respectively. And, after gate electrodes $14_1$, $14_2$ are provided on gate oxide layers $13_1$, $13_2$, resist patterns 15 are provided to cover the semiconductive layer of the p channel transistor area by photolithography, and a first shallow arsenic ion implantation layer 16 is provided below the surface of the layer 12 by selectively implanting arsenic ions in the layer 12 using resist patterns 15 and electrode $14_1$ as a mask.

Referring to FIG. 3B, the resist patterns 15 are removed, and resist patterns 17 are provided to cover the semiconductive layer 12 of the p channel transistor area and a portion of layer 12 near electrode $14_1$. A second deep arsenic ion implantation layer 18 is provided by selectively implanting arsenic ions in layer 12 with high implantation energy using the resist patterns 17 as a mask.

Next, referring to FIG. 3C, the resist patterns 17 are removed, and resist patterns 19 are provided to cover the semiconductive layer of an n channel transistor area by photolithography. A first shallow boron ion implantation layer 20 is provided below the surface of the layer 12 by selectively implanting boron ion in the layer with low implantation energy using resist patterns 19 and electrode 142 as a mask.

Referring now to FIG. 3D, the resist patterns 19 are removed, and resist patterns 21 are provided to cover layer 12 of the n channel transistor area and a portion of layer 12 near the electrode $14_2$ by photolithography. A second deep boron ion implantation layer 22 is provided by selectively implanting boron ions in the layer 12 with high implantation energy using the resist pattern 21 as a mask.

Then, referring to FIG. 3E, the resist patterns 21 are removed and the CMOS device is heat treated. As a result, the first and second arsenic layers 16, 18 are activated, and source and drain regions $23_1$, $24_1$ of n+ type are provided, each of which is shallow near electrode $14_1$ but deep as it extends to a boundary between layer 12 and substrate 11 farther from electrode $14_1$. Source and drain regions $23_2$, $24_2$ of p+ type also are provided, each of which is shallow near electrode $14_2$ but deep as it extends to the boundary between layer 12 and substrate 11 farther from the electrode $14_2$. So, the CMOS device has drain regions $24_1$, $24_2$ of n+ type and p+ type which contact each other over the entire boundary between the n channel and p channel transistors. This CMOS eliminates the leakage current and the short channel effect, as described above. But, the above described process is more complex than the ordinary CMOS process, because it requires the photolithography process and ion implantation process to each be repeated.

SUMMARY OF THE INVENTION

It is, therefore, an object of the present invention to provide a method for making a CMOS device efficiently.

It is another object of the invention to provide a method for making CMOS without leakage current and short channel effect.

According to the invention, the invention provides a method for making a CMOS device comprising:

disposing each of a gate electrode with a gate oxide layer thereunder on a region of n channel and p channel transistors in a semiconductive layer partially disposed on an insulative substrate, selectively, removing at least part of the semiconductive layer existing near the gate electrodes, and, doping n type impurities and p type impurities respectively into n channel and p channel transistors using the gate electrodes as a mask.

DETAILED DESCRIPTION OF THE PREFERRED EMBODIMENT

Figure 1:
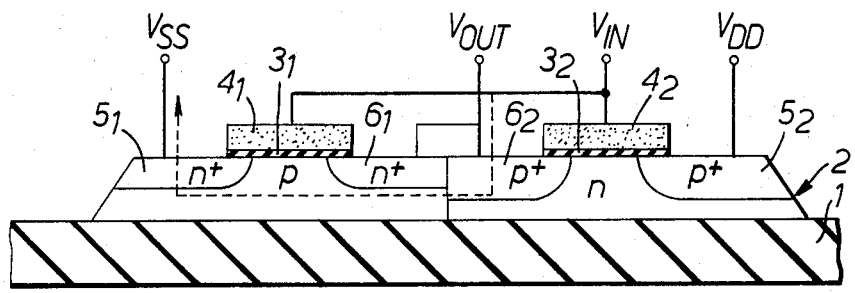
FIG. 1 shows a sectional view of a prior art SOS device.
Figure 2:
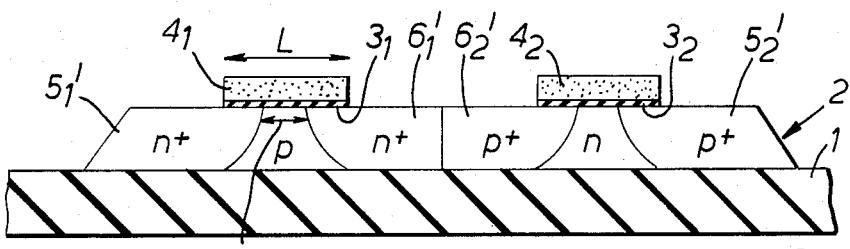
FIG. 2 shows a sectional view of another prior art SOS device.
Figure 3A:
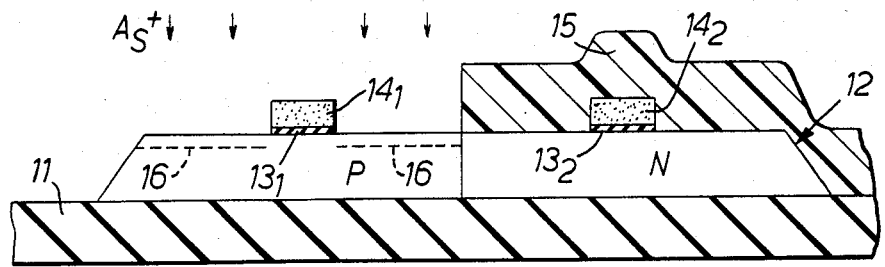
FIGS. 3A–3E show a series of sectional views of an SOS in order to explain a conventional method for manufacturing the same.
Figure 3B:
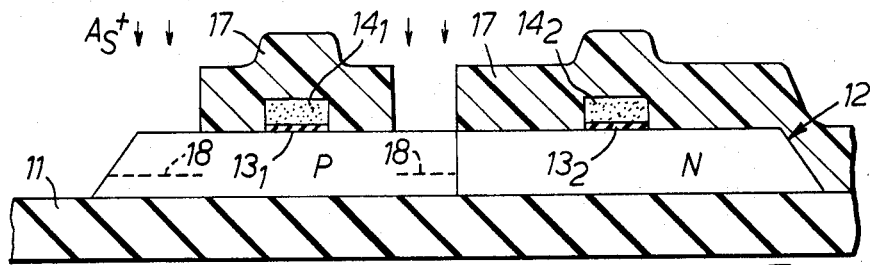
Figure 3C:
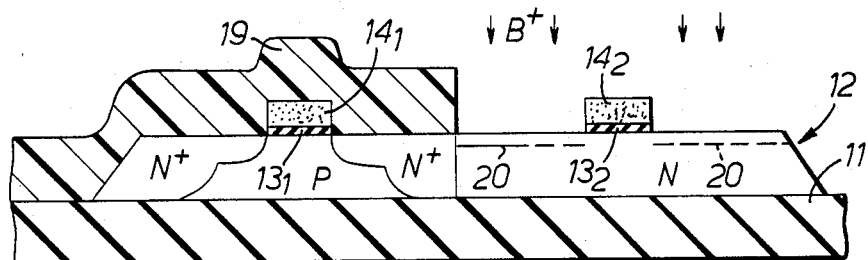
Figure 3D:
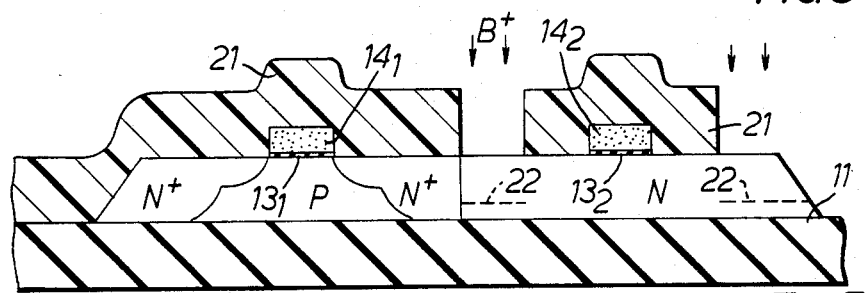
Figure 3E:
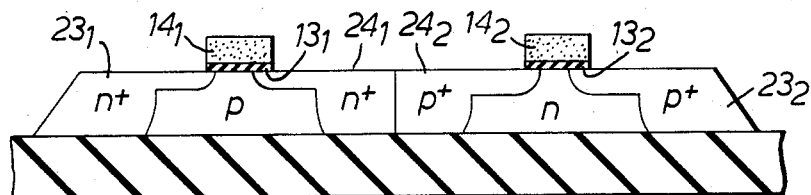
Figure 4A:
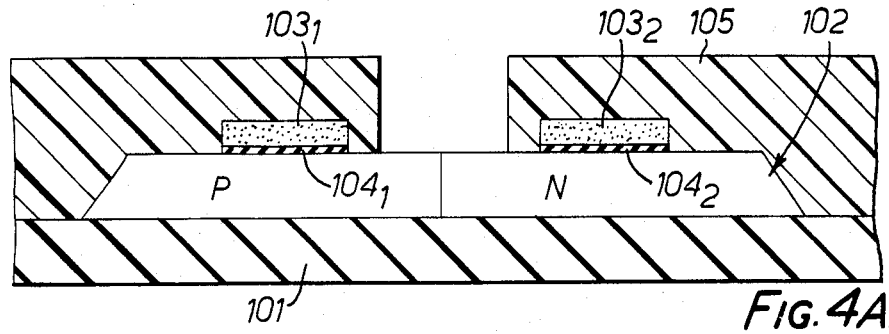
FIGS. 4A–4E show a series of sectional views of a SOS device for explaining an embodiment of the method of the present invention.

Referring to FIGS. 4A to 4E, a semiconductive layer 102 of silicon is positioned on an insulative substrate 101 of sapphire by selectively removing portions of a silicon film which was grown on the substrate 101 by epitaxy. P type impurities, such as boron, and n type impurities, such as phosphorus or arsenic, are respectively implanted by ion implantation in a first element region of the layer 102 which will be the n channel transistor and in a second element region of the layer 102 which will be the p channel transistor. Layer 102 is heat treated in order to control the threshold of the transistors after a silicon oxide layer of 300Å thickness is grown on the surface of layer 102 by heat oxidation. A film of polysilicon doped phosphorus is deposited on the surface of layer 102, and by using photolithography gate electrodes $103_1$, $103_2$ are formed on the first and second element regions of the silicon oxide film and gate oxide layers $104_1$, $104_2$ are formed by etching the silicon oxide film using the gate electrodes $103_1$, $103_2$ as a mask. Further, resist patterns 105, which cover the surface of the layer 102, excepting the boundary of the first and second element regions, are disposed by photolithography (FIG. 4A).

Figure 4B:
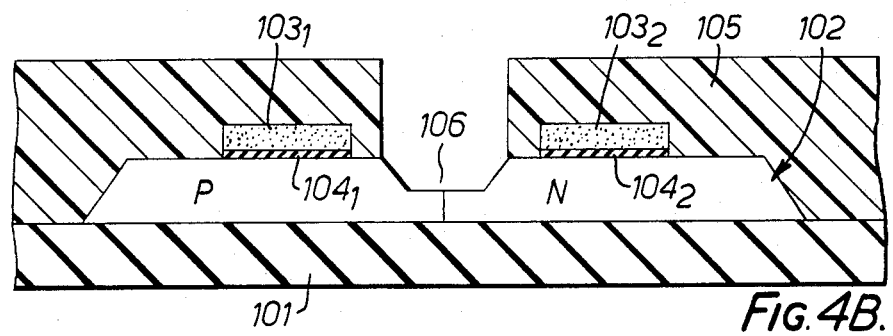

The layer 102 near the boundary between the first and second element regions are etched by using an etching solution of a mixture of potassium hydroxide (KOH) and isopropyl alchohol using the resist pattern 105 as a mask. In consequence, an etched portion 106 with tapered side wall of approximately 0.3 μm in depth is obtained (FIG. 4B).

After resist patterns 105 are removed and resist patterns 107 covering the second element region of the layer 102 are formed, n type impurities, such as arsenic, are implanted by ion implantation with 40 keV of acceleration voltage and a dose of $2 \times 10^{15} cm^{-2}$ to $4 \times 10^{15} cm^{-2}$ using the resist patterns 107 and the gate electrode $103_1$ as a mask.

Figure 4C:
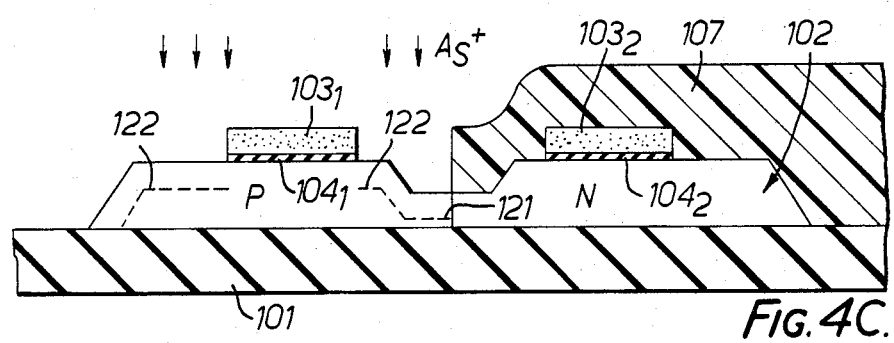

Because of the two levels of thickness of layer 102 a first arsenic ion implantation layer 121, which extends downward to the boundary between layer 102 and the substrate 101, is produced in the etched portion 106, and a second arsenic ion implantation layer 122, which lies near the surface of layer 102 and does not extend to substrate 101, is produced in the unetched portion of layer 102 (FIG. 4C).

Figure 4D:
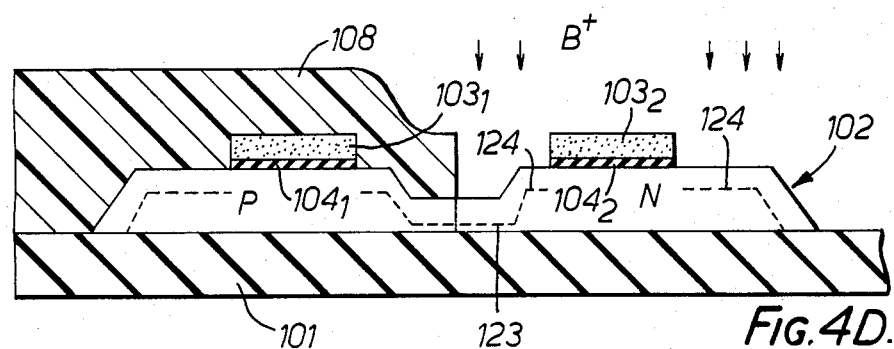

Next, after the resist patterns 107 are removed, resist patterns 108, covering the first element region of the layer are formed using photolitography. P type impurities, such as boron, are implanted by ion implantation under 40 keV of acceleration voltage an a dose of $1 \times 10^{15} cm^{-2}$ to $3 \times 10^{15} cm^{-2}$ using patterns 108 and gate electrode $103_2$ as a mask. Because of the two levels of thickness of layer 102, a first boron ion implantation layer 123, which extends to the boundary between layer 102 and substrate 101, is produced in the etched portion 106, and a second boron ion implantation layer 124, which lies near the surface of the layer 102 and does not extend to substrate 101, is produced in the unetched portion of the layer 102 (FIG. 4D).

Figure 4E:
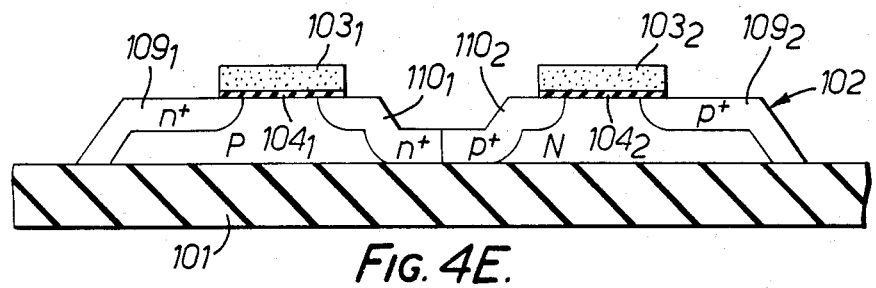

Further, after the resist patterns 108 are removed, layer 102 is heat treated. As a result, arsenic is diffused from the respective first and second arsenic ion implantation layers to form shallow source region $109_1$ of n+ type and drain region $110_1$ of n+ type, which is shallow at the surface of layer 102 near the gate electrode $103_1$ and extends to the boundary between layer 102 and substrate 101 near the boundary between the n channel and p channel transistors. At the same time, by diffusing boron respectively from the first and second boron ion implantation layers, a shallow source region $109_2$ of p+ type is produced and drain region $110_2$ of p+ type, which is shallow at the surface of layer 102 near gate electrode $103_2$ and extends to the boundary between layer 102 and substrate 101 near the boundary between the n channel and the p channel transistors. Finally, the CMOS includes the n channel and p channel MOS transistors with the drains of n+ and p+ $110_1$, $110_2$, which are fabricated with high impurities contacting at their boundary (FIG. 4E).

Referring to FIGS. 5A to 5E, another embodiment of this invention is explained. A silicon layer 102 is disposed on sapphire substrate 101, an oxide layer is applied on layer 102, and arsenic and boron are implanted in layer 102 in order to control the threshold voltage of the transistors. After that, a conductive layer which can be selectively etched on silicon, such as molybdenum (Mo), is deposited on the entire surface of layer 102. Other suitable materials for the gate electrodes include aluminum, tungsten, titanium, platinum, palladium, or an alloy of one of these materials as well as a metallic silicide.

Figure 5A:
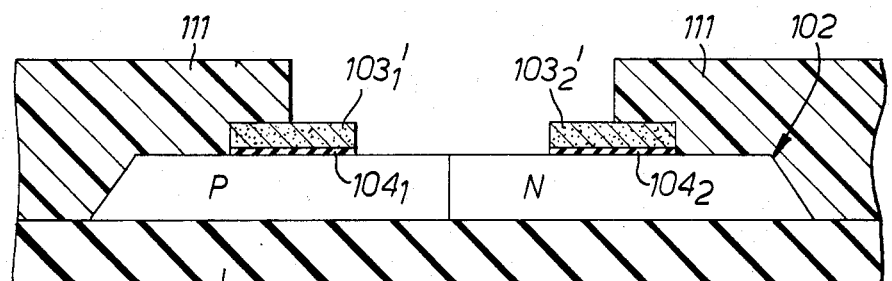
FIGS. 5A–5B show a series of sectional views of a SOS device for explaining another embodiment of the method of the present invention.

Using gate electrodes $103_1$, $103_2$, which are produced by patterning the Mo layer, gate oxide layers $104_1$, $104_2$ are produced by etching the oxide layer on the silicon layer. Further, resist patterns 111, which cover layer 102 and a part of gate electrodes $103_1'$, $103_2'$, except a part of the layer existing between gate electrodes $103_1'$ $103_2'$ (FIG. 5A).

Figure 5B:
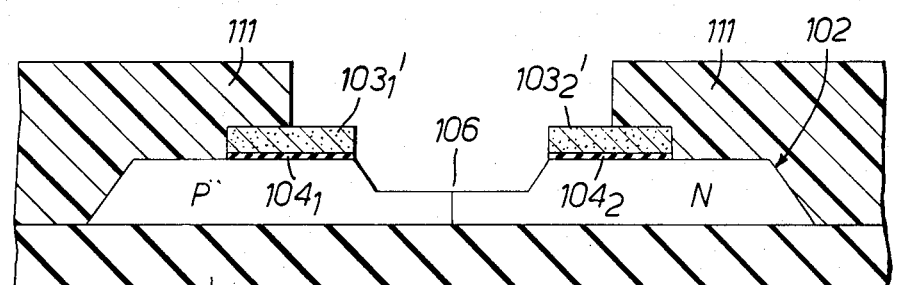

Using resist patterns 111 and gate electrodes $103_1'$, $103_2'$ as a mask, an etched portion 106 of the layer 102 is disposed between electrodes $103_1'$, $103_2'$ by etching the silicon layer 102 approximately 0.3 μm in depth with an etching solution of a mixture of potassium hydroxide and insopropyl alcohol (FIG. 5B). After that, the CMOS is produced by the same process as described with respect to the first embodiment of the invention.

Another embodiment of the invention is explained referring to FIGS. 6A to 6E.

Figure 6A:
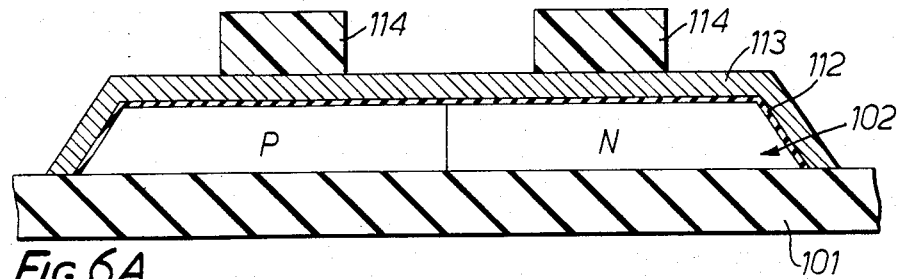
FIGS. 6A–6E show a series of sectional views of a SOS device for explaining another embodiment of the method of the present invention.

First, after the silicon layer 102 is disposed on the sapphire substrate 101, an oxide layer 112 of 300Å thickness is formed on the entire surface of layer 102 by a heat oxidation treatment. Arsenic and boron are implanted into the P-channel transistor area and the N-channel transistor area of layer 102, respectively, by ion implantation in order to control the threshold voltage of the transistors to be formed thereon. After Mo layer 113 is deposited over the entire surface of layer 102 by vacuum evaporation, the resist patterns 114 are left in the area of the Mo layer 113 where the gate electrodes are to be disposed by photolithography (FIG. 6A).

Figure 6B:
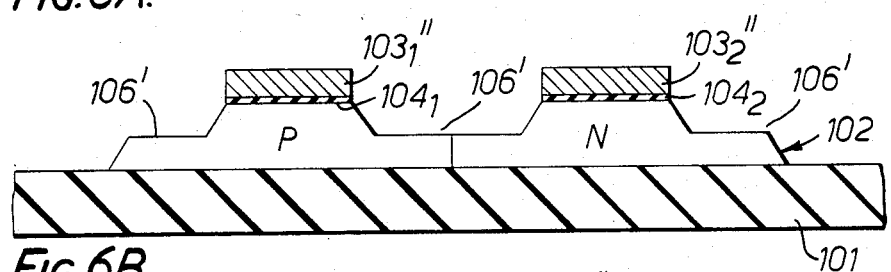

The Mo layer 113 is etched by chemical etching or RIE so that the gate electrodes $103_1''$, $103_2''$ are left, and the oxide layer 112 is also etched leaving the gate oxide layers $104_1$, $104_2$ disposed under the gate electrodes $103_1''$, $103_2''$. The etched portion 106'' with tapered side wall of 0.3 μm in depth is then produced by anisotropic etching with an etching solution consisting of potassium hydroxide and isopropyl alcohol. At that time, resist patterns 114 and gate electrodes $103_1''$, $103_2''$ are used as masks for etching. Finally, the resist patterns 114 are removed (FIG. 6B).

Figure 6C:
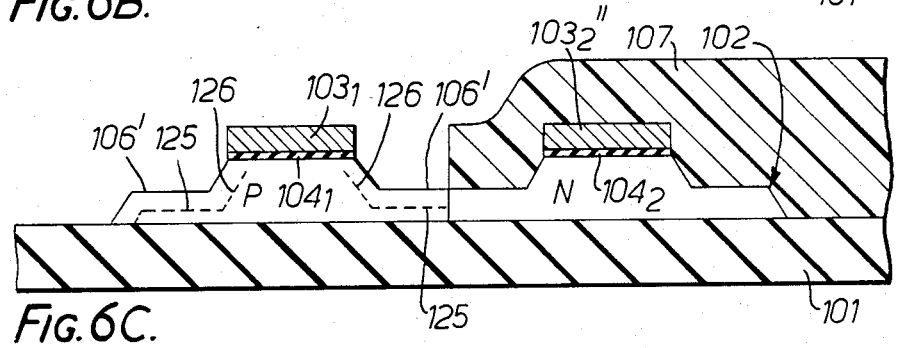

Next resist pattern 107, which cover the second element region of the layer 102, is produced by photolithography. N type impurities, such as arsenic, are implanted by ion implantation with 40 keV of acceleration voltage and a dose of $2 \times 10^{15} cm^{-2}$ to $4 \times 10^{15} cm^{-2}$ using resist pattern 107 and gate electrode $103_1''$ as masks. At this stage, a first arsenic ion implantation layer 125 is produced near the boundary between the layer 102 and the substrate 101, and a second arsenic ion implantation layer 126 is also produced near the surface of the side wall of the etched region 106'. This result is obtained because of the difference between the thickness of flat portion of the etched portion 106' and that of the side wall of the etched portion 106' (FIG. 6C).

Figure 6D:
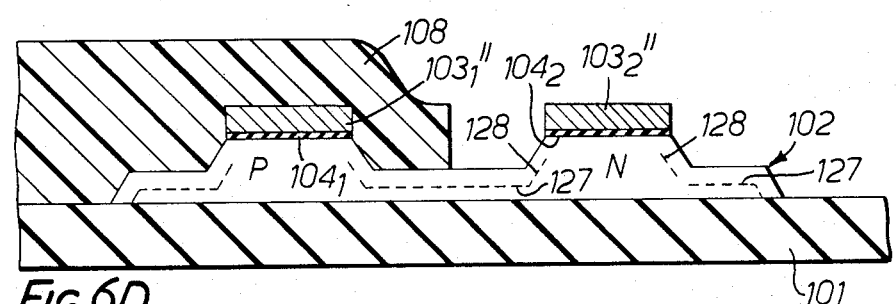

After the resist pattern 107 is removed, another resist pattern 108, which covers the first element region of the layer 102, is produced. P type impurities, such as boron, are implanted by ion implantation with 40 keV of acceleration voltage and a dose of about $1 \times 10^{15} cm^{-2}$ to $3 \times 10^{15} cm^{-2}$ using resist patterns 108 and gate electrode $103_2''$ as masks. At this stage, a first boron ion implantation layer 127, which exists near the boundary between the layer 102 and the substrate 101, and a second boron ion implantation layer 128, which exists near the surface of the side wall of the etching portion 106', is also produced. This result is obtained due to the difference between the thickness of a flat portion of the etching portion 106' and that of the side wall of the etched portion 106' (FIG. 6D).

Finally, after the resist patterns 108 are removed, the layer 102 is heat treated. As a result of the heat treatment, the arsenic ions are diffused from the first and the second arsenic ion implantation layers 125, 126, which exist at different implantation depths, and source and drain regions $109_1'$, $110_1'$ of n+ type are produced. Each of these regions $109_1'$, $110_1'$ is located at a shallow depth near the gate electrode $103_1''$ (in the side wall of the etched portions 106') and extends to the boundary between layer 102 and substrate 101 farther from the gate electrode $103_1''$ (in the horizontal mid-portion of the etched portion 106'). At the same time, the boron ions are diffused from the first and the second boron ion implantation layers 127, 128, which exist at different implantation depths, and second source and drain regions $109_2'$, $110_2'$ of p+ type are produced. Each of these regions $109_1'$, $110_2'$ is located at a shallow depth near the gate electrode $103_2''$ in the side wall of the etched portions 106', and extends to the boundary between the layer 102 and substrate 101 farther from the gate electrode $103_1'''$. The n+ drain region $109_2'$ of the n channel transistor and the p+ drain region $110_2'$ of the p channel transistor contact one another at the boundary.

Another embodiment of the invention is explained referring to FIGS. 7A to 7E.

Figure 7A:
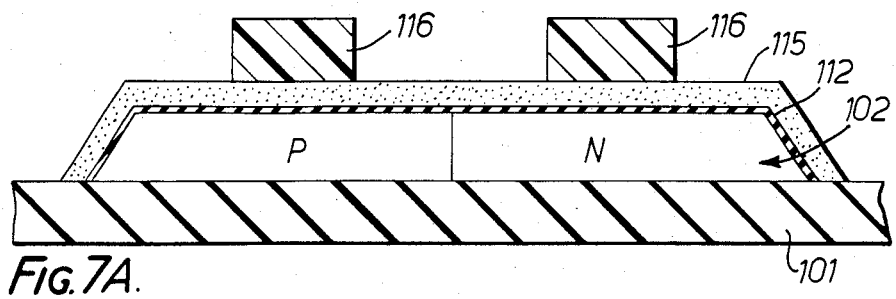
FIGS. 7A–7E show a series of sectional views of a SOS device for explaining yet another embodiment of the method of the present invention.

At first, after the silicon layer 102 is disposed on the sapphire substrate 101, an oxide layer 112 is produced on the entire surface of layer 102 by heat oxidation treatment. Arsenic and boron are then implanted in order to control the threshold voltage of the transistors. Polysilicon layer 115 doped with phosphorus is deposited on the entire surface of the layer 102 and resist patterns 116 are disposed on the predetermined portion of the polysilicon layer 115 for forming electrodes by photolithography. (FIG. 7A).

Figure 7B:
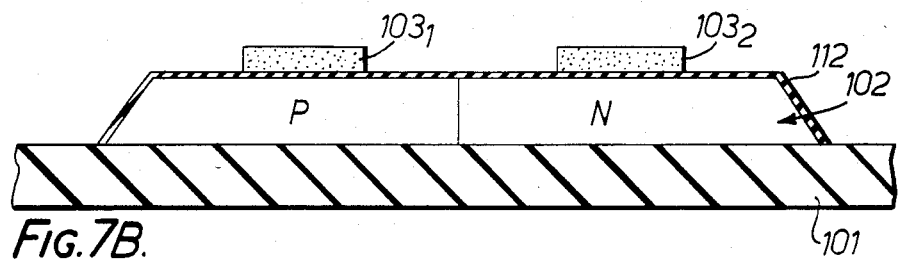

Gate electrodes $103_1$, $103_2$ are left by selectively etching the polysilicon layer 115 using resist patterns 116 as a mask (FIG. 7B).

Figure 7C:
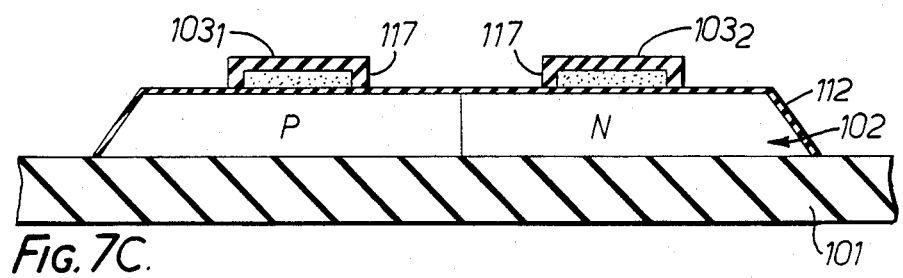

An oxide layer 117, thicker than the oxide layer 112, is grown on the surface of the gate electrodes $103_1$, $103_2$ of polysilicon by heat oxidation treatment (FIG. 7C).

Figure 7D:
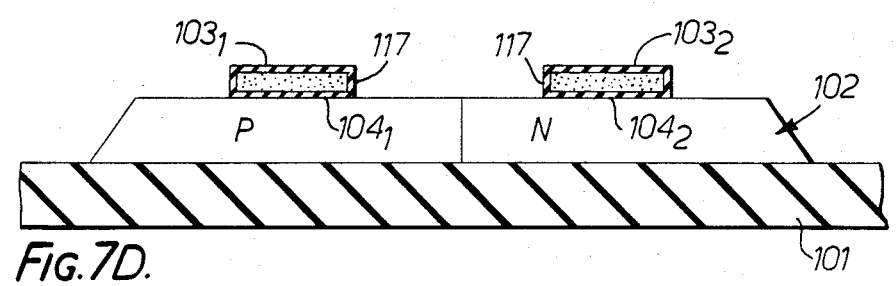

Gate oxide layers $104_1$, $104_2$ and oxide layer 117 surrounding the gate electrode $103_1$, $103_2$ are produced by etching using $NH_4F$ solution thereby removing the remainder of the oxide layer 112. (FIG. 7D).

Figure 7E:
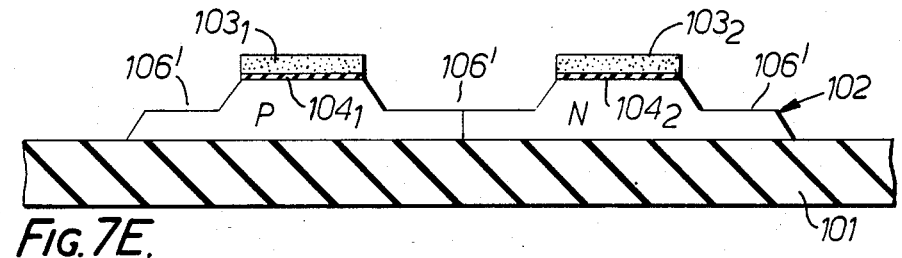

After that, layer 102 is etched to obtain etched portion 106' with tapered side wall of 0.3 μm depth by using anisotropic etching with etching solution consisting of potassium hydroxide and insopropyl alcohol. The oxide layer 117 is used as a mask for etching (FIG. 7E).

Figure 6E:
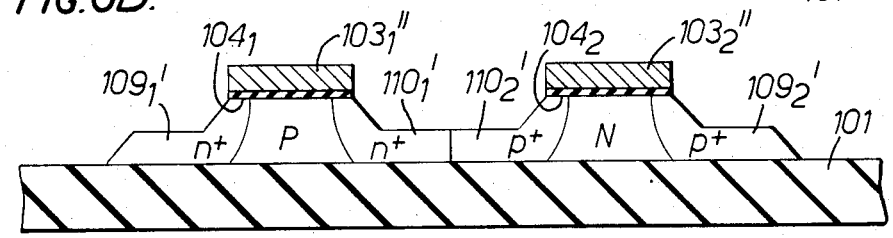

The remaining steps are the same as shown in FIGS. 6C to 6E. A CMOS with high impurities contacting at the boundary between the n+ drain region of n channel and p channel transistor can thereby be produced.

Another type of insulative substrate other than sapphire, such as spinel or silicon dioxide $SiO_2$ or silicon nitride $Si_3N_4$ can be used for the CMOS. The silicon layer is isolated by the air in the embodiment of this invention, but silicon, which is isolated by dielectric substrate, can be used for the CMOS.

What is claimed is:

1. A process for making a complementary metal oxide semiconductor (CMOS) with a high impurity density contact region between elements at a boundary between respective drain regions of a p-channel metal oxide semiconductor (MOS) transistor and an n-channel MOS transistor comprising:

forming at least two gate electrodes over an oxide layer on a semiconductive layer;

removing a portion of the semiconductive layer between the gate electrodes so that the thickness of the portion of the semiconductive layer between the gate electrodes is less than that of the semiconductor layer under the gate electrodes; and doping n type and p type impurities in respective predetermined portions of the semiconductive layer to form drain and source regions for the respective n-channel and p-channel MOS transistors constructed using the gate electrodes as masks so that the respective drain regions extend to the substrate under where said portion of the semiconductor layer was removed.

2. The process for making CMOS according to claim 1 wherein the step for removing at least the portion of the semiconductive layer between the gate electrodes is accomplished by using resist patterns produced by photolithography.

3. The process for making CMOS according to claim 1 wherein the step for removing at least the portion of the semiconductive layer existing between the gate electrodes is accomplished by using the gate electrodes and resist patterns, which cover part of the gate electrodes, and the semiconductive layer except the surface of the semiconductive layer existing between the gate electrodes.

4. The process for making CMOS according to claim 3 wherein the gate electrode is made of one selected from the group consisting of aluminum, molybdenum, tungsten, titanium, platinum, palladium, and metallic silicide.

5. The process for making the CMOS according to claim 1 wherein the step for removing at least the portion of the semiconductive layer existing between the gate electrodes is done by using resist patterns, which are used for patterning the gate electrodes, as a mask.

6. A process for making a complementary metal oxide semiconductor (CMOS) with a high impurity density contact region between elements at a boundary between respective drain regions of a p-channel metal oxide semiconductor (MOS) transistor and an n-channel MOS transistor comprising:

forming a first conductive layer on a substrate;

forming a first thin oxide layer on said semiconductor layer;

forming at least two gate electrodes on said semiconductor layer over said thin oxide layer;

covering said gate electrodes with a thick oxide layer, removing the thin oxide layer covering the semiconductive layer and part of the thick oxide layer leaving a thin oxide layer on the gate electrodes;

removing at least a portion of the semiconductor layer between said gate electrodes by using the gate electrodes covered with the oxide layer as a mask so that the thickness of the portion of the semiconductive layer between the gate electrode is less than that of the semiconductive layer under the gate electrodes; and doping n type and p type impurities in respective predetermined portions of the semiconductive layer to form drain and source regions for the respective n-channel and p-channel MOS transistors constructed using the gate electrodes as masks.

7. The process for making CMOS according to claim 6, wherein the step for removing at least the portion of the semiconductive layer existing between the gate electrode is done by anisotropic etching.

* * * * *